(12) United States Patent
Araki et al.

(10) Patent No.: US 7,615,515 B2
(45) Date of Patent: Nov. 10, 2009

(54) OXIDE SUPERCONDUCTOR AND METHOD OF PREPARING THE SAME

(75) Inventors: Takeshi Araki, Tokyo (JP); Koichi Nakao, Hachioji (JP); Izumi Hirabayashi, Tokyo (JP)

(73) Assignees: Kabushiki Kaisha Toshiba, Tokyo (JP); International Superconductivity Technology Center, Tokyo (JP)

( * ) Notice: Subject to any disclaimer, the term of this patent is extended or adjusted under 35 U.S.C. 154(b) by 503 days.

(21) Appl. No.: 11/226,361

(22) Filed: Sep. 15, 2005

(65) Prior Publication Data

US 2006/0058195 A1 Mar. 16, 2006

(30) Foreign Application Priority Data

Sep. 16, 2004 (JP) ............... 2004-270113

(51) Int. Cl.
*H01L 39/24* (2006.01)
*C04B 35/00* (2006.01)

(52) U.S. Cl. .................. 505/123; 505/126; 505/461
(58) Field of Classification Search .............. 505/123, 505/126, 236, 238, 461
See application file for complete search history.

(56) References Cited

U.S. PATENT DOCUMENTS

| 5,004,725 | A | * | 4/1991 | Ovshinsky et al. | ......... 505/123 |
|---|---|---|---|---|---|
| 5,108,986 | A | * | 4/1992 | Kohno et al. | ......... 505/123 |
| 5,227,362 | A | * | 7/1993 | Ovshinsky et al. | ......... 505/123 |
| 5,426,092 | A | * | 6/1995 | Ovshinsky et al. | ......... 505/461 |
| 5,614,471 | A | * | 3/1997 | Ohkura et al. | ......... 505/126 |
| 6,586,042 | B2 | | 7/2003 | Araki et al. | |
| 6,821,930 | B2 | | 11/2004 | Araki et al. | |
| 2004/0192559 | A1 | | 9/2004 | Araki et al. | |

OTHER PUBLICATIONS

Burin et al "Disorder and nonlinear magnetic response of high Tc superconductors", Journal of Alloys and Compounds (1993), 195(1-2), 611-14. Abstract Only.*

Kim et al "Characterization of yttrium barium copper oxide fluoride (YBa2Cu307-xFy) superconducting materials made by a sol- gel process", Chongi Hakhoe Nonmunchi (1992), 41(5), 525-32. Abstract Only.*

R.L. Wang, et al., "Critical current density and flux pinning in $Gd_{1-x}Y_x Ba_2 Cu_3 O_{7-y}$ epitaxial thin films", Physica C, Elsevier Science B.V., vol. 250, Aug. 1, 1995, pp. 55-58.

Jianmin Hao, et al., "The influence of lattice deformation on $J_c$ in epitaxially grown $Y_{1-x} Ho_x Ba_2 Cu_3 O_{7-y}$ films", Superconductor Science and Technology, vol. 10, No. 12, Dec. 18, 1997, pp. 966-969 and 1 cover page.

(Continued)

*Primary Examiner*—Mark Kopec
(74) *Attorney, Agent, or Firm*—Oblon, Spivak, McClelland, Maier & Neustadt, L.L.P.

(57) ABSTRACT

An oxide superconductor includes a main component represented by the following formula: $LnBa_2Cu_3O_{7-x}$, where Ln comprises two or more types of elements selected from the group consisting of Gd, Tb, Dy, Ho, Er, Tm, and Y, and a content of each element is 10 to 90 mol %, and fluorine at a molar ratio of $10^{-2}$ to $10^{-6}$ with respect to copper.

12 Claims, 7 Drawing Sheets

OTHER PUBLICATIONS

Takeshi Araki, et al., "Review of a chemical approach to $YBa_2Cu_3O_{7-x}$ coated superconductors-metalorganic deposition using trifluoroacetates", Institute of Physics Publishing, Superconductor Science and Technology 16, Sep. 18, 2003, pp. R71-R94.

Takeshi Araki, et al., "Growth model and the effect of CuO nanocrystallites on the properties of chemically derived epitaxial thin films of $YBa_2Cu_3O_{7-x}$", Journal of Applied Physics, vol. 92, No. 6, Sep. 15, 2002, pp. 3318-3325.

Toshihiro Iguchi, et al., "Metal-organic deposition of RE-Ba-Cu-O (RE=Dy, Ho, Er, and Tm) films using trifluoroacetates", Physica C 392-396, 2003, pp. 900-904.

Takeshi Araki, et al., "Fabrication of $YBa_2Cu_3O_{7-x}$ film by metalorganic deposition method using trifluoroacetates and its process conditions", Cryogenics 41, 2001, pp. 675-681.

R. H. Hammond, et al., "Correlation Between the in Situ Growth Conditions of YBCO Thin Films and the Thermodynamic Stability Criteria", Physica C 162-164, 1989, pp. 703-704.

Takeshi Araki, et al., "Large-area uniform ultrahigh-Jc $YBa_2Cu_3O_{7-x}$ film fabricated by the metalorganic deposition method using trifluoroacetates", Institute of Physics Publishing Superconductor Science and Technology 14, 2001, pp. L21-L24.

Toshihiro Iguchi, et al., "Fabrication of Gd-Ba-Cu-O films by the metal-organic deposition method using trifluoroacetates", Institute of Physics Publishing, Superconductor Science and Technology 15, Sep. 18, 2002, 1415-1420.

U.S. Appl. No. 11/857,089, filed Sep. 18, 2007, Araki.

* cited by examiner

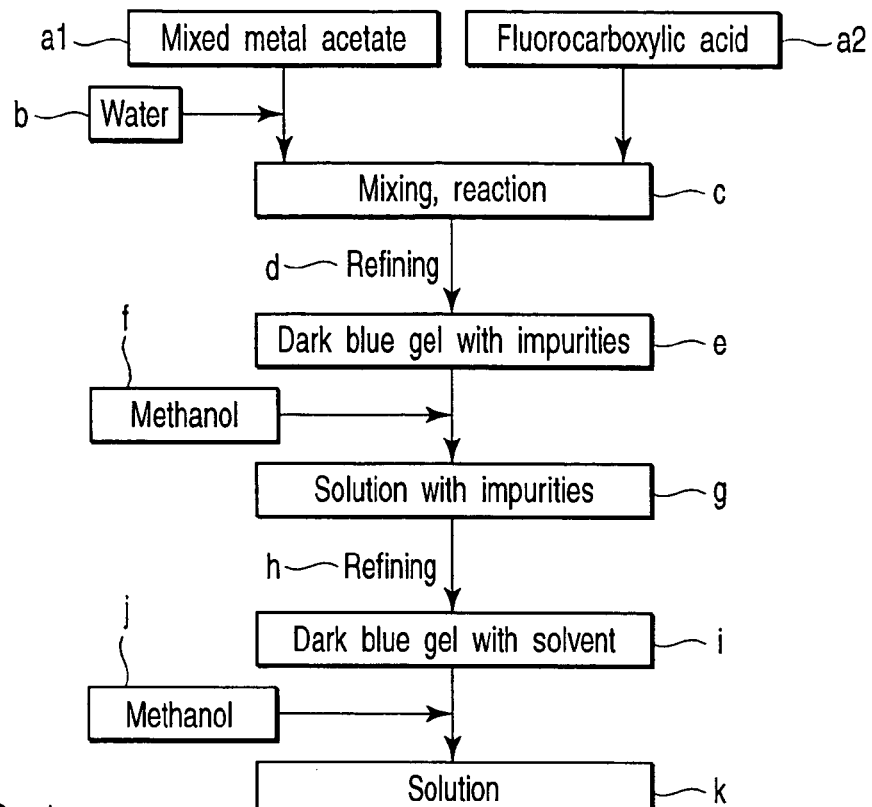
F I G. 1
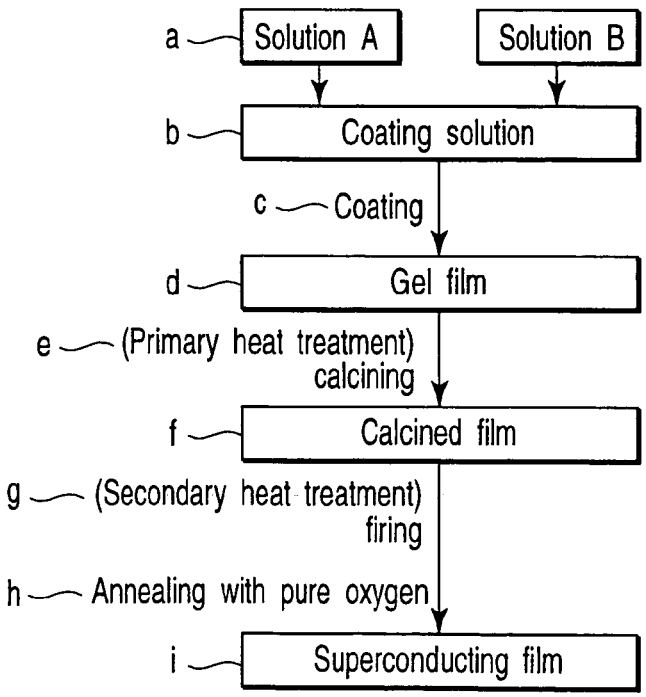
F I G. 2

OXIDE SUPERCONDUCTOR AND METHOD OF PREPARING THE SAME

CROSS-REFERENCE TO RELATED APPLICATIONS

This application is based upon and claims the benefit of priority from prior Japanese Patent Application No. 2004-270113, filed Sep. 16, 2004, the entire contents of which are incorporated herein by reference.

BACKGROUND OF THE INVENTION

1. Field of the Invention

The present invention relates to an oxide superconductor and a method of manufacturing the same.

2. Description of the Related Art

High critical-current oxide superconducting materials which are recently beginning to be put into practical use are expected to be usefully applied to, e.g., a fusion reactor, a magnetically levitated train, a particle accelerator, and a magnetic resonance imaging apparatus (MRI), and some materials are already put into practical use.

Major oxide superconductors are bismuth-based and yttrium-based (to be referred to as Y-based hereinafter) superconductors, and the Y-based superconductors having good magnetic field characteristics are attracting a great deal of attention as materials which will be put into practical use in the near future. The Y-based superconductors are oxides represented by $YBa_2Cu_3O_{7-x}$, and oxides having a structure in which yttrium is substituted with a lanthanoide series element are also known as superconductors having good magnetic field characteristics. Known examples of the lanthanoide series elements are lanthanum, neodymium, samarium, gadolinium, terbium, dysprosium, holmium, erbium, thulium, and ytterbium.

Examples of a method of preparing a Y-based superconducting film are pulsed laser deposition (PLD), liquid phase epitaxy (LPE), electron beam (EB) processing, and metalorganic deposition (MOD). Of these methods, non-vacuum, low-cost MOD is being spotlighted in recent years and extensively studied mainly in the United States of America and Japan. It is recently reported that among other MOD methods, MOD using trifluoroacetates (referred to as TFA-MOD hereinafter) can prepare a superconducting film having good properties.

MOD is a method comprising: coating a single-crystal substrate with a chemical solution by spin coating or dip coating, followed by drying the chemical solution to form a gel film, and performing heat treatments twice under normal pressure for the gel film, i.e., calcining and firing, to prepare a superconducting film. In this method, an oxide is formed by decomposing organic materials contained in a precursor by calcining, and a biaxially oriented structure is formed in the oxide layer by firing performed in a range of 700° C. to 900° C.

MOD has a problem that crystallites are formed after calcining, a disordered oriented structure is formed from these crystallites during firing, and the influence of the phenomenon particularly increases when the thickness is 100 nm or more. To provide a highly oriented structure by this method, it is important to perform rapid heating and rapid cooling within a short period of time so that no crystallites are formed by crystal growth of the thermally decomposed oxide in the calcined film. The rapid heating and rapid cooling are performed by loading and unloading a sample into and from an electric furnace. However, it is difficult to form a homogeneous film because the degree of heating of the sample differs between on the central portion and on the edge portion. Therefore, this method requires a large electric furnace capable of precise temperature control. In addition, it is difficult to prepare a superconducting film having good characteristics with high reproducibility because there exist not a little different phases.

As a method that improves MOD described above by which crystallites in the calcined film exert no influence on the fired structure, TFA-MOD is developed. TFA-MOD was first reported by Gupta et al. in 1988. At that time, the purity of solutions was presumably low owing to the effect of starting materials, so TFA-MOD did not provide any particularly outstanding characteristics or reproducibility like other MOD methods. Afterwards, McIntyre et al. improved TFA-MOD, and a superconducting critical current density ($J_C$) exceeding 1 $MA/cm^2$ at 77 K and 0 T was realized.

Although TFA-MOD is a type of MOD, crystallites in the calcined film exert no influence on orientation of the fired structure. TEM observation shows that a large number of nanocrystallites exist in the cross-section of the calcined film, but all these nanocrystallites disappear after firing, so a biaxially oriented structure is formed with high reproducibility (T. Araki and I. Hirabayashi, Supercond. Sci. Technol., 16, R71 (2003)). In TFA-MOD, therefore, unlike in normal MOD, carbon which is harmful to superconducting characteristics can be expelled almost completely by calcining continued over 10 hours or more, so a superconducting film having good characteristics can be prepared with high reproducibility (T. Araki, Cryogenics, 41, 675 (2002)). Initially, the growth mechanism during firing was unknown. However, it is recently found that a quasi-liquid network is formed due to mixing of fluorine, and this eliminates crystallites in the calcined film. This reveals in principle that TFA-MOD provides high reproducibility and good characteristics which cannot be realized by any normal MOD (T. Araki et al., J. Appl. Phys., 92, 3318 (2002)). Since a chemical equilibrium reaction deeply contributes to the growth through the formation of the quasi-liquid network, a slight amount of fluorine remains in the film, which is a feature of TFA-MOD. However, it is also found that this slight amount of residual fluorine does not deteriorate the superconducting characteristics.

It is thought that one of the causes of the excellent characteristics and amazing reproducibility of the Y-based superconducting film provided by TFA-MOD is reduction of a/b-axis-oriented grains. The a/b-axis-oriented grains have such a structure that the c-axis-oriented grain, in which a superconducting current flows in a direction parallel to the plane, is fallen down sideways. Since in the a/b-axis-oriented grains a superconducting current primarily flows in a direction perpendicular to the plane, the particular grains significantly degrade the superconducting current in the direction parallel to the plane, and thus, degrade the superconducting characteristics. The following three points are presently regarded as main causes of the formation of the a/b-axis-oriented grains.

(1) The firing conditions (oxygen partial pressure and temperature) are not optimum.

(2) Impurities exist in the solution.

(3) The lattice constants of the c-axis-oriented grains and single-crystal substrate are mismatched.

For the factor (1), Hammond and Bormann reported that there are optimum conditions independent of the manufacturing method of a superconductor (R. H. Hammond and R. Bormann, Physica C 162-164, 703 (1989)). According to this report, whenever the oxygen partial pressure during firing reduces by half, the optimum firing temperature decreases by about 25° C. The optimum firing conditions of MOD and TFA-MOD are the same as, e.g., PLD.

For the factor (2), experiments have shown that when an impurity amount reduces, the ratio of the c-axis-oriented grains increases. It is also disclosed that the superconducting characteristics greatly improve as well (Japanese Patent No. 3,556,586).

For the factor (3), a superconductor presumably has the a-, b-, and c-axis lengths unique to the material. However, when a thin film is formed on a single-crystal substrate, the film epitaxially grows in a strained state in accordance with the lattice constant of the substrate for the reason described below. While the film thickness of a superconductor obtained by this method is 0.1 to 10 μm, the thickness of a single-crystal substrate is about 0.4 to 1.0 mm, i.e., approximately 1,000 times the film thickness of the superconductor, so the substrate is very strong. Therefore, if the lattice constants of the thin film and substrate are different, the superconducting film presumably grows in a strained state. Immediately above the single-crystal substrate, substantially the same lattice constant as that of the substrate is probably observed. When a thin film about 0.1 μm thick is formed and phase identification is performed by XRD, a value close to the lattice constant of the substrate is observed. However, if the film thickness increases, the lattice constant of the film presumably approaches the intrinsic lattice constant of the superconductor. Whether the a/b-axis-oriented grains or c-axis-oriented grains grow more easily is determined by the lattice constant of the single-crystal substrate.

When TFA-MOD is used to prepare YBCO superconducting films having film thicknesses of 150 to 300 nm on four types of single-crystal substrates, i.e., $LaAlO_3$, $NdGdO_3$, $SrTiO_3$ and $CeO_2/YSZ$, peak intensity ratios of the a/b-axis-oriented grains determined by XRD measurement decrease in the order of $NdGdO_3$, $LaAlO_3$, $SrTiO_3$ and $CeO_2/YSZ$, regardless of the film thickness. That is, when the $CeO_2/YSZ$ substrate is used, a superconducting film with a highest $J_C$ value, i.e., 11 MA/cm$^2$ (77 K, 0 T) for a film thickness of 0.22 μm, is provided (T. Araki and I. Hirabayashi, Supercond. Sci. Technol., 16, R71 (2003)). In order to increase the c-axis orientation ratio, it is desirable to change the intrinsic lattice constant of the substrate or superconductor. However, the lattice constant of the substrate cannot be continuously changed. This is so because materials usable as the single-crystal substrate are limited, and their lattice constants are discontinuous values as well.

Accordingly, it is being demanded to increase the c-axis-oriented grain ratio by adjusting the axial length of the superconductor. As described above, Y element in the YBCO superconductor can be substituted with a specific Ln series element. The Ln series elements exhibit lanthanoide contraction by which the ion radius contracts in accordance with the atomic number. This presently makes it difficult to measure the a-, b-, and c-axis lengths of each Ln-based superconductor, but the axial lengths of the individual superconductors may be substantially different. It is expected to prepare a superconductor with a high ratio of c-axis-oriented grains by mixing two or more types of Ln-based superconductors in accordance with the substrate used.

As described above, La, Nd, Sm, Gd, Tb, Dy, Ho, Er, Tm, Yb, and the like are known as Ln series elements which show superconducting characteristics when substituting Y. However, it is difficult to apply TFA-MOD to some of these Ln series elements. In the case of La, Nd, or Sm with a smaller atomic number, when a methanol solution of trifluoroacetate salt is to be prepared, an esterification reaction occurs to allow decomposition of the salt. If refining is performed under conditions by which no esterification reaction occurs, good superconducting characteristics cannot be obtained because of large amounts of impurities. In the case of Yb with a larger atomic number, the solubility thereof is extremely low, so it is impossible to prepare any solution from which a film with a practical thickness can be obtained.

In the case of Gd, Tb, Dy, Ho, Er, or Tm, similar to yttrium trifluoroacetate, a high-purity methanol solution can be prepared by the SIG (Solvent-Into-Gel) method (T. Araki et al., Supercond. Sci. Technol., 14, L21 (2001), Japanese Patent No. 3,556,586), and a superconductor containing a single Ln series element can be provided. The critical current density ($J_C$) of each of these superconductors is 3 to 4 MA/cm$^2$ (77 K, 0 T), which is a sufficiently high value in terms of usefulness (T. Iguchi et al., Physica C 392-396 900 (2003); T. Iguchi et al., Superconduct. Sci. Technol., 15, 1415 (2002)). However, this $J_C$ value is about half that of the YBCO-based superconductor, i.e., 7 MA/cm$^2$ (77 K, 0 T). It was expected that mixing the individual Ln-based solutions would provide a superconductor in which the a-, b-, and c-axis lengths of each superconductor containing a single Ln series element can be freely adjusted within a certain range. However, any superconductor prepared by mixing the individual Ln-based solutions exhibited a low $J_C$ value. More specifically, a superconductor prepared by mixing the individual Ln-based solutions at a ratio of 1:1 exhibited a lowered $J_C$ value of about 1 MA/cm$^2$ (77 K, 0 T). The purities of lanthanoide acetates used as Ln sources were 97% to 98%, so it is likely that impurities increased the ratio of the a/b-axis-oriented grains and deteriorated the characteristics.

BRIEF SUMMARY OF THE INVENTION

An oxide superconductor according to an aspect of the present invention comprises: a main component represented by the following formula:

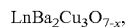

$LnBa_2Cu_3O_{7-x}$, where Ln contains two or more types of elements selected from the group consisting of Gd, Tb, Dy, Ho, Er, Tm, and Y, and a content of each element is 10 to 90 mol %; and fluorine at a molar ratio of $10^{-2}$ to $10^{-6}$ with respect to copper.

A method of preparing an oxide superconductor according to another aspect of the present invention comprises: reacting solutions of an acetate of metal Ln (where Ln comprises two or more types of elements selected from the group consisting of Gd, Tb, Dy, Ho, Er, Tm, and Y, and a content of each element is 10 to 90 mol %), barium acetate, and copper acetate, singly or in a form of a mixture, with fluorocarboxylic acid, followed by refining a reaction product to produce a gel; dissolving the gel in a solvent mainly containing alcohol such that Ln, barium, and copper are contained at a molar ratio of about 1:2:3 to prepare a coating solution; and coating a substrate with the coating solution to form a film, followed by calcining and firing the film to prepare an oxide superconducting film; wherein a gel obtained by first refining is dissolved in alcohol to provide a solution containing impurities, and then the solution is refined again to provide a gel containing a reduced amount of impurities.

BRIEF DESCRIPTION OF THE SEVERAL VIEWS OF THE DRAWING

FIG. 1 is a flowchart for preparing a coating solution in an embodiment of the present invention;

FIG. 2 is a flowchart for preparing a superconductor in an embodiment of the present invention;

DETAILED DESCRIPTION OF THE INVENTION

Figure 3:
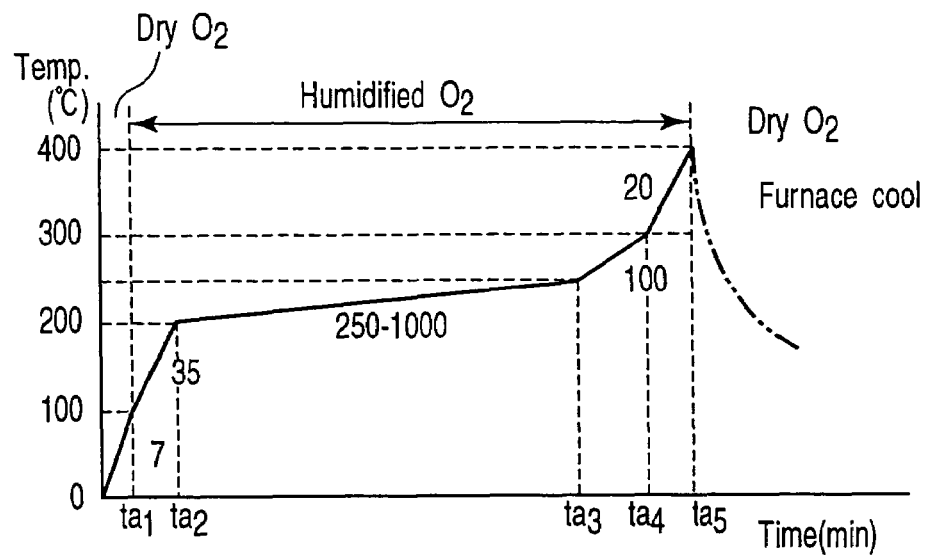
FIG. 3 is a graph showing a temperature profile during calcining in an embodiment of the present invention.

Embodiments of the present invention will be described below.

In a method according to the embodiments of the present invention, an oxide superconducting film is prepared by the procedures described below.

First, referring to FIG. 1, a process of reacting mixed metal acetate with fluorocarboxylic acid and refining the reaction product will be described. In FIG. 1, the mixed metal acetate a1 is used as a generic term for metal acetates containing metal Ln, barium acetate, and copper acetate. As the metal Ln, two or more types of metals selected from the group consisting of gadolinium, terbium, dysprosium, holmium, erbium, thulium, and ytterbium are used. Note that it is also possible to prepare acetate solutions individually and mix the solutions. The mixing timing of the acetates is not particularly limited. The molar ratio of metal Ln, barium, and copper is about 1:2:3. However, even if the molar ratio deviates from 1:2:3 by about 10%, no fatal effect is exerted on the characteristics of the resultant superconductor.

The fluorocarboxylic acid a2 is mixed and reacted with the mixed metal acetate, and the reaction product is refined. The fluorocarboxylic acid is selected from trifluoroacetic acid (TFA), pentafluoropropionic acid (PFP), and heptafluorobutanoic acid (HFB). However, since barium acetate is reacted with PFP or HFB so as to produce a precipitate, it is necessary to avoid a combination of barium acetate and PFP or HFB. If PFP or HFB is used in a reaction with another acetate, at least barium acetate is reacted with TFA, the reaction product is refined, and the refined product is mixed with the reaction product of the other acetate. When a solution is prepared by using barium acetate and TFA, an intermediate refined product is semitransparent white powder, but the rest is not largely different from the method shown in FIG. 1. No precipitate is produced when the concentrations of barium trifluoroacetate and other metal pentafluoropropionates are set to exceed a predetermined value.

Note that significant change is not found even when fluorocarboxylic acid partly substituted with fluorine is used. However, if the amount of hydrogen increases, the dissociation constant decreases, resulting in remaining a large amount of unreacted acetate. Experience has shown that the molar ratio of hydrogen is desirably about 10% or less of the total fluorine. When the fluorocarboxylic acid mainly contains TFA, in other words, when fluorocarboxylic acid having two carbon atoms is used, there is no material which produces a precipitate, so all the acetates can be dissolved in ion exchange water and reacted with the fluorocarboxylic acid at once. Even when the fluorocarboxylic acid mainly containing TFA contains a small amount of difluoroacetic acid and monofluoroacetic acid, which are partially substituted with fluorine, by about 10 mol % or less in a total, no fatal degradation of the characteristics of a superconductor is found.

Carboxylic acid and fluorocarboxylic acid are known to be significantly different in chemical properties; carboxylic acid is a weak acid, but fluorocarboxylic acid is a very strong acid. This is so because, when an acid dissociates into ions, acidity is determined by whether oxygen, which is to be a counter ion to hydrogen, is apt to be negatively charged or not. In carboxylic acid having no fluorine, hydrogen directly bonded to carbon donates an electron to oxygen via carbon. Upon dissociation, therefore, oxygen is negatively charged easily, and this oxygen and hydrogen strongly attract each other. As a consequence, the dissociation constant becomes a low value, which means that the carboxylic acid is a weak acid. On the other hand, in fluorocarboxylic acid, fluorine, having electronegativity greater than that of oxygen, attracts an electron of oxygen via carbon. Therefore, oxygen neutralizes and stabilizes upon dissociation. This allows hydrogen ions to readily maintain the ionized state, which means that the fluorocarboxylic acid is a strong acid. Accordingly, the dissociation constants of, e.g., acetic acid and trifluoroacetic acid are different by four orders of magnitude, so almost every acetate is substituted into trifluoroacetate at the moment the acetate and trifluoroacetic acid are mixed.

It is also possible to react metal acetate containing metal Ln with fluorocarboxylic acid having three or more carbon atoms, e.g., pentafluoropropionic acid, the fluorocarboxylic group may be substituted with another fluorocarboxylic group having a smaller number of carbon atoms, e.g., a trifluoroacetic acid group. In TFA-MOD, the mechanism by which carbon is expelled functions during calcining, so harmful carbon is readily removed. Since, however, a small amount of carbon may remain, trifluoroacetic acid is more desirable than pentafluoropropionic acid. Even when the fluorocarboxylic group having a greater number of carbon atoms is substituted with the fluorocarboxylic group having a smaller number of carbon atoms, it poses no problem in solubility, and the solubility rather increases. That is, when all salts are mixed after being changed into trifluoroacetates, no precipitate is created at any given concentration.

Refining is performed after the acetate and the fluorocarboxylic acid are reacted, and the SIG (Solvent-Into-Gel) method is used in this refining. In the SIG method, a large amount of methanol is added to gel to substitute impurities (water and acetic acid) with the forcedly introduced methanol, thereby providing powder or gel with low impurity content. By the use of the SIG method which provides a high-purity solution by dissolving the powder or gel in methanol again, water which is particularly harmful in TFA-MOD can be reduced to about 1/20.

Next, referring to FIG. 2, a process of preparing a coating solution by mixing a plurality of solutions, depositing a gel film by coating a substrate with the coating solution, and providing an oxide superconductor by performing calcining and firing will be described. In FIG. 2, solutions A and B contain different elements corresponding to metal Ln, and these elements are assumed to be metals M and N here. Solutions A and B can be mixed at an arbitrary ratio, and the molar ratio of the sum of metals M and N, barium, and copper is about 1:2:3 in the resultant coating solution b. A gel film is formed by coating a substrate with this coating solution. After that, an oxide superconductor is provided by performing calcining (a primary heat treatment), firing (a secondary heat treatment), and annealing with pure oxygen. The oxide superconductor may also be obtained by using three or more types of solutions in a step in FIG. 2.

The formed gel film is calcined in an electric furnace to form a calcined film made of a metal oxyfluoride. FIG. 3 shows an example of a temperature profile (and atmosphere) during calcining.

(1) From time 0 to time $t_{a1}$ (about 7 minutes from the start of the heat treatment), the temperature inside a heat treating furnace is abruptly raised from room temperature to 100° C. The interior of the heat treating furnace is placed in a dry oxygen atmosphere under normal pressure. Note that all subsequent heat treatment steps can be performed under normal pressure.

(2) At time $t_{a1}$, the atmosphere in the heat treating furnace is changed to humidified oxygen atmosphere under normal pressure. From time $t_{a1}$ to time $t_{a2}$ (about 42 minutes from the start of the heat treatment), the temperature inside the heat treating furnace is raised from 100° C. to 200° C. In this state, the humidified oxygen atmosphere is set within the humidity range of 1.2% to 12.1%. The humidity range corresponds to a dew point range of 10° C. to 50° C. To adjust the humidity, bubbles of an atmosphere gas (oxygen gas) are passed through water at a predetermined temperature. That is, the humidity is determined by the saturated vapor pressure in bubbles when they pass through water. The saturated vapor pressure is determined by the temperature. To set the dew point temperature corresponding to the humidity to be lower than room temperature, the atmosphere gas is divided to pass bubbles of only a portion of the gas through water, and then the divided gases are mixed. The main purpose of the humidification is to prevent sublimation of copper fluoroacetate which sublimes most easily, by partially hydrolyzing the copper fluoroacetate into an oligomer so as to increase an apparent molecular weight. In the case where the fluoroacetic acid is trifluoroacetic acid, hydrolysis is performed as follows. Since F and H atoms at the two ends of the copper salt form hydrogen bonds by which four to five molecules are combined, the apparent molecular weight increases and sublimation thereof is suppressed.

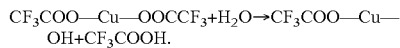

$$CF_3COO—Cu—OOCCF_3+H_2O \rightarrow CF_3COO—Cu—OH+CF_3COOH.$$

(3) From time $t_{a2}$ to time $t_{a3}$ (about 4 hours and 10 minutes to 16 hours and 40 minutes), the temperature inside the furnace is gradually raised from 200° C. to 250° C. The temperature is thus gradually raised in order to prevent the partially hydrolyzed salt from combusting by an abrupt reaction to leave carbon components behind. The long-time hydrolysis cleaves the covalent bonds of the salt by which metal oxides ($Y_2O_3$, BaO, and CuO) are formed temporarily. For Y and Ba oxides, oxygen is substituted by fluorine to produce a compound containing oxygen and fluorine at an indeterminate ratio, as described in T. Araki and I. Hirabayashi, Supercond. Sci. Technol., 16, R71 (2003). Since the reaction gradually advances in this state and the temperature is held, only a single compound CuO causes grain growth to form nanocrystallites of a few tens of nm. Y and Ba components with an indeterminate ratio of fluorine and oxygen cannot cause grain growth and become amorphous.

(4) From time $t_{a3}$ to time $t_{a4}$ and from time $t_{a4}$ to time $t_{a5}$ (about 2 hours), the temperature inside the heat treating furnace is raised from 250° C. to 400° C. Unnecessary organic materials decomposed during the time $t_{a2}$ to $t_{a3}$ remain through a hydrogen bond or the like in the film. In this step, these unnecessary organic materials are removed by heating.

(5) After time $t_{a5}$, furnace cool is performed while a gas is supplied. The obtained calcined film is subjected to firing and oxygen annealing in an electric furnace into a superconducting film.

Figure 4:
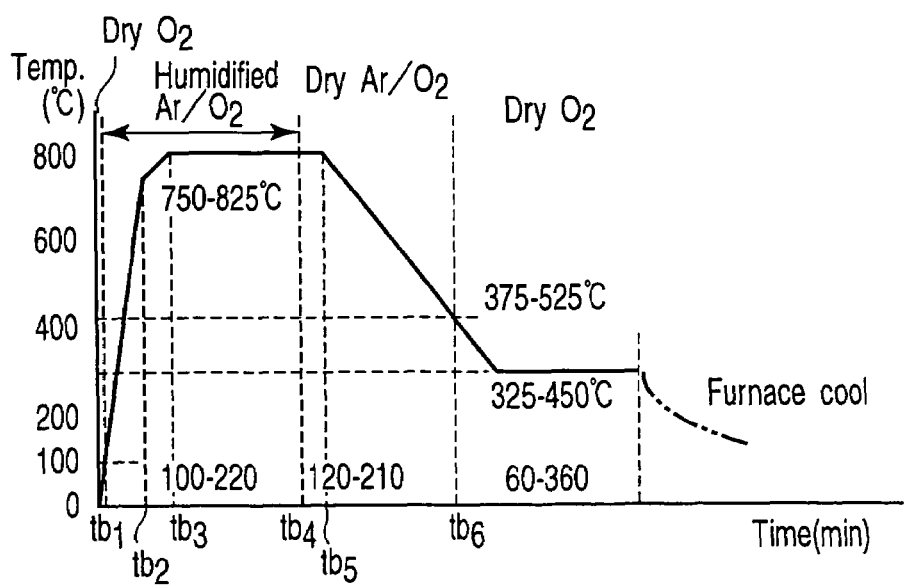
FIG. 4 is a graph showing a temperature profile during firing in an embodiment of the present invention.

FIG. 4 shows an example of a temperature profile (and atmospheres) during firing.

(6) From time 0 to time $t_{b1}$ (about 7 minutes from the start of the heat treatment), the temperature inside the heat treating furnace is abruptly raised from room temperature to 100° C. In this case, the interior of the heat treating furnace is placed in an oxygen-mixed argon gas atmosphere under normal pressure. An optimum oxygen concentration is determined by a metal type of a superconductor to be fired or firing temperature. Conventionally, in the case of firing a gel into Y-based superconducting film ($YBa_2Cu_3O_{7-x}$), optimal conditions are such that setting the oxygen partial pressure to 1,000 ppm at 800° C., and then reducing the oxygen concentration to approximately half every temperature lowering of 25° C. For all solutions in the present invention, the oxygen concentration is preferably almost halved whenever the temperature is lowered by 25° C., but the oxygen partial pressure during firing at 800° C. changes in accordance with whether Gd is contained. When no Gd is contained, the oxygen partial pressure is 1,000 ppm, i.e., the same as that for the conventional Y-base superconducting film. When Gd is contained, the oxygen partial pressure is 1,000 ppm for 0% of Gd, and 250 ppm for 100% of Gd. When the content of Gd is between them, the oxygen partial pressure is logarithmically proportionally distributed in accordance with the mixing ratio. In this manner, almost optimum superconductors can be provided. Even if the oxygen partial pressure is set at 1,000 ppm when it should be 250 ppm, superconducting characteristics are not zero, but a superconductor having deteriorated characteristics to about 1/3 is obtained. Note that all heat treatment steps after this step can be performed at atmospheric pressure.

(7) From time $t_{b1}$ to time $t_{b2}$ (about 33 to 37 minutes, the temperature is raised to the maximum temperature at a rate of 20° C. per minute) and from time $t_{b2}$ to time $t_{b3}$ (about 5 minutes), the temperature inside the heat treating furnace is raised to the maximum temperature of 750° C. to 825° C. At time $t_{b1}$, the dry gas is humidified by the same method as in calcining. The humidification amount can be selected from a wide range between 1.2% (dew point of 10° C.) and 30.7% (dew point of 70° C.). When the humidification amount is increased, the reaction rate is increased. The increase in reaction rate is estimated to be equal to the one-half power of the increase in the humidification amount (details are described in T. Araki and I. Hirabayashi, Supercond. Sci. Technol., 16, R71 (2003)). The heating rate is decreased from $t_{b2}$ to $t_{b3}$ in order to decrease the excess rise of the electric furnace temperature at $t_{b3}$. At a temperature of about 650° C., the formation of a quasi liquid phase is started inside the film by water vapor, and a quasi-liquid network is formed inside the film (T. Araki et al., J. Appl. Phys., 92, 3318 (2002)).

(8) From time $t_{b3}$ to time $t_{b4}$ (about 45 minutes to 3 hours and 40 minutes: This time depends on the highest temperature and final thickness. The lower the temperature and the larger the thickness is, the longer the time is), $LnBa_2Cu_3O_6$ (Ln is two or more types of elements selected from Gd, Tb, Dy, Ho, Er, Tm, and Y) is sequentially formed on the substrate from the quasi-liquid network, and at the same time HF gas and the like are released. Simplified chemical reactions are described as follows.

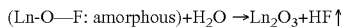

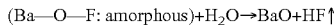

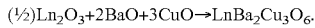

(9) From time $t_{b4}$, the gas is switched to a dry gas. This is because the oxide $LnBa_2CuO_6$ formed until $t_{b4}$ is stable to water vapor at high temperatures near 800° C. but is decomposed by water vapor at around 600° C.

(9) From time $t_{b4}$, the gas is switched to a dry gas. The gas is thus switched to a dry gas because the oxide $LnBa_2Cu_3O_6$ formed until $t_{b4}$ is stable in vapor at high temperatures near 800° C. but decomposes by vapor at around 600° C.

(10) From time $t_{b4}$ to time $t_{b5}$ (about 10 minutes) and from time $t_{b5}$ to $t_{b6}$ (about 2 hours to 3 hours and 30 minutes), the temperature inside the heat treating furnace is kept lowered. During this cooling, the formed oxide remains unchanged.

(11) At time $t_{b6}$, the oxygen-mixed argon gas is switched to dry oxygen gas. By this oxygen annealing, $LnBa_2Cu_3O_6$ is turned into $LnBa_2Cu_3O_{7-x}$ (x=0.07), a superconducting film. The temperature for switching to oxygen depends on the metal Ln. The temperature was 525° C. for conventional Y-based superconducting film. However, if Gd is contained as Ln, annealing is preferably started at 425° C. to 525° C., i.e., a slightly lower temperature.

Figure 5A:
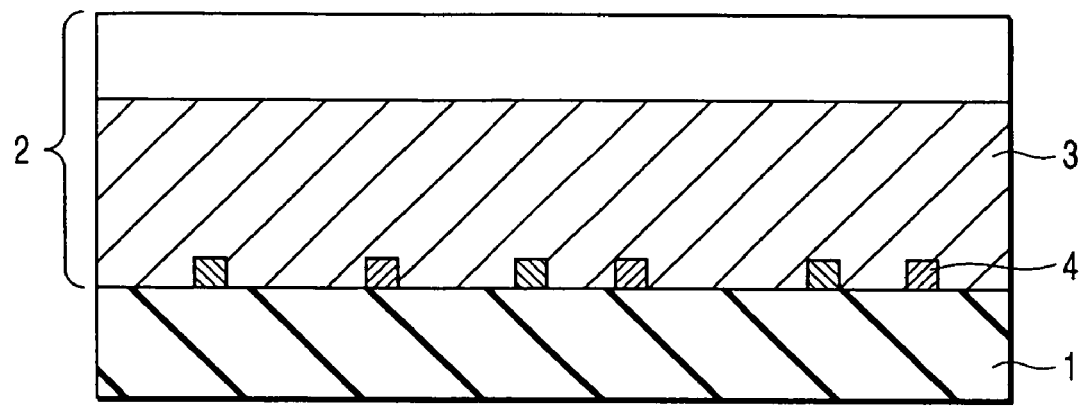
FIGS. 5A and 5B are schematic views showing a crystal growth mechanism in an embodiment of the present invention.
Figure 5B:
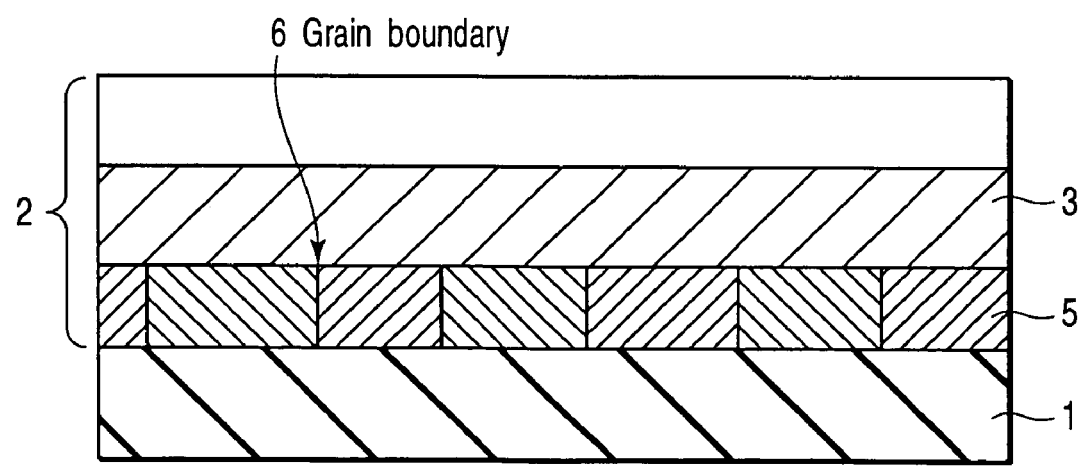

The mechanism of growth of superconducting crystal grains during firing will be described below with reference to FIGS. 5A and 5B. FIG. 5A shows the initial stage of growth, and FIG. 5B shows the intermediate stage of growth. In the initial stage of growth shown in FIG. 5A, nuclei 4 of superconducting grains are homogenously created in a superconductor precursor 3 constituting a calcined film 2 formed on a substrate 1. In the intermediate stage of growth shown in FIG. 5B, crystals 5 grow from the nuclei 4 in a lateral direction by which grain boundaries 6 are formed in positions where adjacent crystals 5 come across with each other.

In the superconductor grown based on the mechanism, grain boundaries are regularly arranged every 5 to 50 nm in positions where crystallites come across with each other. The interval of the grain boundaries seems to vary from 5 to 50 nm in accordance with the annealing conditions in firing. The periodic grain-boundary formation within the microscopic region is effective to trap magnetic fluxes, and presumably improves both the characteristics and reproducibility of the superconductor manufactured by the method of the present invention. Actually, a current of about 200 A is observed between the two ends of a wire of 10-m class at high reproducibility.

Incidentally, factors to deteriorate the superconducting characteristics include decrease in the ratio of c-axis-oriented grains resulting from the heat treatment conditions or the impurities in the solution, besides the direct influence from the residual carbon. In a Ln-based superconductor, as in a Y-based superconductor, c-axis-oriented grains are formed on the substrate surface which makes it possible to conduct a superconducting current in a direction parallel to the substrate plane. However, since the a-axis length and b-axis length are substantially equal and is substantially ⅓ the c-axis length, a/b-axis-oriented grains, which have such a structure that the c-axis-oriented grain is fallen down sideways, are easily formed. When this structure is formed, an electric current flows only in a direction perpendicular to the substrate plane, bringing about deterioration in the superconducting characteristics due to cutoff of the superconducting current in the direction parallel to the substrate plane. In addition, the growth rate of the c-axis-oriented grains in the direction parallel to the substrate plane is regarded as nearly 100 times that in the stacking direction. That is, the a/b-axis-oriented grains rapidly grow in the direction perpendicular to the substrate plane which would also be a factor to deteriorate the superconducting characteristics.

The nucleation probabilities for the c-axis-oriented grains and for the a/b-axis-oriented grains are presumably determined by the matching with the lattice constant of the substrate surface. It is also possible to maximize the probability of formation of c-axis-oriented grains by selecting the heat treatment conditions (oxygen partial pressure and firing temperature). However, it is found that even under conditions by which the c-axis-oriented grains are easily formed, the a/b-axis-oriented grains are formed under the presence of impurities, bringing about deterioration in the superconducting characteristics. A thick Y-based superconducting film manufactured from a solution prepared without use of the SIG method exhibits particularly deteriorated characteristics. The structure of the a/b-axis-oriented grains grows to the vicinity of the surface by nucleation. In a thick film, the generation rate of the a/b-axis-oriented grains per unit area is increased, which readily deteriorates the superconducting characteristics. On the other hand, when a Y-based superconducting film is manufactured by TFA-MOD using a high-purity solution prepared by the SIG method, the influence of the a/b-axis-oriented grains is low, and a high $J_C$ value is provided with high reproducibility as described previously.

In the present invention as well, the influence of the a/b-axis-oriented grains can be reduced by using high-purity solutions prepared by the SIG method. In the present invention, all solutions of Ln-based material are high-purity solutions prepared by the SIG method, in order to prevent deterioration of the characteristics. If a high-purity solution was not used, it was found that the $J_C$ value of a superconducting film containing a single Ln metal decreased to about half. Especially when two types of solutions containing impurities were mixed at 1:1, the $J_C$ value significantly decreased to about ⅓ compared to the value when the solutions were not mixed. The mechanism by which the $J_C$ value largely decreases when solutions are mixed is presently unknown. It is conceivable that there exists an impurity unique to each Ln-based material, which results in presence of two or more types of impurities when the solutions are mixed and the impurities exert a synergetic effect to largely degrade the $J_C$ value.

The oxide superconductor according to the embodiments of the present invention can be defined in more detail as follows. That is, the oxide superconductor is formed as a film on a substrate, and comprises a main component represented by $LnBa_2Cu_3O_{7-x}$ (where Ln comprises two or more types of elements selected from the group consisting of gadolinium, terbium, dysprosium, holmium, erbium, thulium, and ytterbium, and a content of each element is 10 to 90 mol %), and fluorine at a molar ratio of $10^{-2}$ to $10^{-6}$ with respect to copper. The film defined herein has a thickness of 0.05 to 10 μm. Letting $I_c$ be the peak intensity of c-axis-oriented grains and $I_{ab}$ be the peak intensity of a/b-axis-oriented grains, the ratio $r_{ab}=I_{ab}/(I_c+I_{ab})$ is defined as an index indicating the ratio of the a/b-axis-oriented grains. In the oxide superconductor according to the embodiments of the present invention, $r_{ab}$ is 15% or less for all metals Ln. The film also has a structure that an area ratio of a biaxially oriented layer at the interface between the substrate and the $LnBa_2Cu_3O_{7-x}$ film is not less than 95%, and a ratio of a biaxially oriented layer in a surface portion of the film is not more than 80% based on transmission electron microscope (TEM) observation in a cross-section perpendicular to the substrate plane. The film also has a structure that grain boundaries having a bonding angle of about 0.2° to 1° are regularly arranged every 5 to 50 nm based on transmission electron microscope (TEM) observation in a plane parallel to the substrate and apart by 50 nm from the substrate in a direction perpendicular to the substrate.

The method according to the embodiments of the present invention makes it possible to prepare a thin oxide superconducting film in which the a-, b-, and c-axis lengths are substantially changed and the change is reflected on the high-$T_C$ value by preparing solutions the impurity amount of which is reduced by the SIG method in MOD using fluorocarboxylic acid, and mixing the solutions. Accordingly, it is possible not only to form a thick superconducting film on a single-crystal substrate, but also to preferentially form c-axis-oriented grains on a metal substrate having an interlayer the lattice constant of which can be relatively easily changed, with making it possible to prepare superconductors having $J_C$ values higher than those of the conventional superconductors. It is also possible to provide oxide superconductors which do not deteriorate their characteristics even when Gd, Tb, Dy, Ho, Er, Tm, and Y are mixed at any ratios.

EXAMPLES

Example 1

Powder of about 3.7 hydrate of $(CH_3COO)_3Y$, $(CH_3COO)_2Ba$ anhydride, and blue powder of about 1.0 hydrate of $(CH_3COO)_2Cu$ were dissolved in ion exchange water such that a molar ratio of Y:Ba:Cu was 1:2:3 to prepare an acetate solution. The acetate solution and an equimolar amount of trifluoroacetic acid ($CF_3COOH$, TFA) were mixed and stirred in an eggplant type flask. The solution mixture was reacted and refined under reduced pressure for about 10 hours with a rotary evaporator to provide a dark blue gel SL1Yspg (system preliminary gel).

The gel SL1Yspg was completely dissolved by adding methanol equivalent to a weight about 100 times that of the gel to provide a blue solution. The blue solution was refined again under reduced pressure for about 12 hours with a rotary evaporator to provide a dark blue gel SL1Ysg (this method will be referred to as an SIG (Solvent-Into-Gel) method hereinafter). The gel SL1Ysg was dissolved in methanol again and diluted with a measuring flask to provide a coating solution SL1Ys with a concentration of 1.50 mol/L in terms of metal ions.

The density of the solution was determined by measuring the weights before and after the concentration adjustment with a measuring flask, and the weight of the mixture was calculated by weight management when solutions were mixed (to be described later).

A coating solution SL1Gds with a concentration of 1.50 mol/L in terms of metal ions was provided following the same procedures as above, except that powder of about 4.4 hydrate of $(CH_3COO)_3Gd$ was used instead of about 3.7 hydrate of $(CH_3COO)_3Y$.

A coating solution SL1Hos with a concentration of 1.50 mol/L in terms of metal ions was provided following the same procedures as above, except that powder of about 5.1 hydrate of $(CH_3COO)_3Ho$ was used instead of about 3.7 hydrate of $(CH_3COO)_3Y$.

A coating solution SL1Tms with a concentration of 1.50 mol/L in terms of metal ions was provided following the same procedures as above, except that powder of about 4.3 hydrate of $(CH_3COO)_3Tm$ was used instead of about 3.7 hydrate of $(CH_3COO)_3Y$.

Mixed coating solutions SL1x91YGd, SL1x82YGd, SL1x73YGd, SL1x64YGd, SL1x55YGd, SL1x46YGd, SL1x37YGd, SL1x28YGd, and SL1x19YGd were provided by mixing the coating solutions SL1Ys and SL1Gds at ratios of 9:1, 8:2, 7:3, 6:4, 5:5, 4:6, 3:7, 2:8, and 1:9, respectively.

Mixed coating solutions SL1x91YHo, SL1x82YHo, SL1x73YHo, SL1x64YHo, SL1x55YHo, SL1x46YHo, SL1x37YHo, SL1x28YHo, and SL1x19YHo were provided by mixing the coating solutions SL1Ys and SL1Hos in the same manner as above.

Mixed coating solutions SL1x91YTm, SL1x82YTm, SL1x73YTm, SL1x64YTm, SL1x55YTm, SL1x46YTm, SL1x37YTm, SL1x28YTm, and SL1x19YTm were obtained by mixing the coating solutions SL1Ys and SL1Tms in the same manner as above.

A (100) $LaAlO_3$ single-crystal substrate was spin-coated with each unmixed or mixed coating solution. The spin-coating conditions were set to an acceleration time of 0.2 sec, a rotational speed of 2,000 rpm, and a retention time of 150 sec. Then, calcining was performed by the method shown in FIG. 3. In this calcining, the heat treatment from $t_{a2}$ to $t_{a3}$ was performed in 4.2% humidified pure oxygen atmosphere from 200° C. to 250° C. over 11 hours and 43 minutes. Subsequently, firing was performed under the conditions shown in FIG. 4. In this firing, the heat treatment in 4.2% humidified 1,000-ppm oxygen mixed argon atmosphere from $t_{b3}$ to $t_{b4}$ was performed at 800° C., and the heat treatment in dry pure oxygen atmosphere after $t_{b6}$ was performed at 525° C. or less. In this manner, superconductor films were prepared from the individual coating solutions. Samples of the resultant superconductor films were named by attaching Fm to the ends of the names of coating solutions. For example, a superconductor obtained from a coating solution SL1Ys was SL1YsFm, and a superconductor obtained from a coating solution SL1x55YTm was SL1x55YTmFm.

For the calcined film prepared by calcining the coating solution SL1Ys and superconducting film SL1YsFm prepared by firing, the element distribution from the film surface toward the substrate was measured by SIMS. The results are shown in FIGS. 6 and 7.

Figure 6:
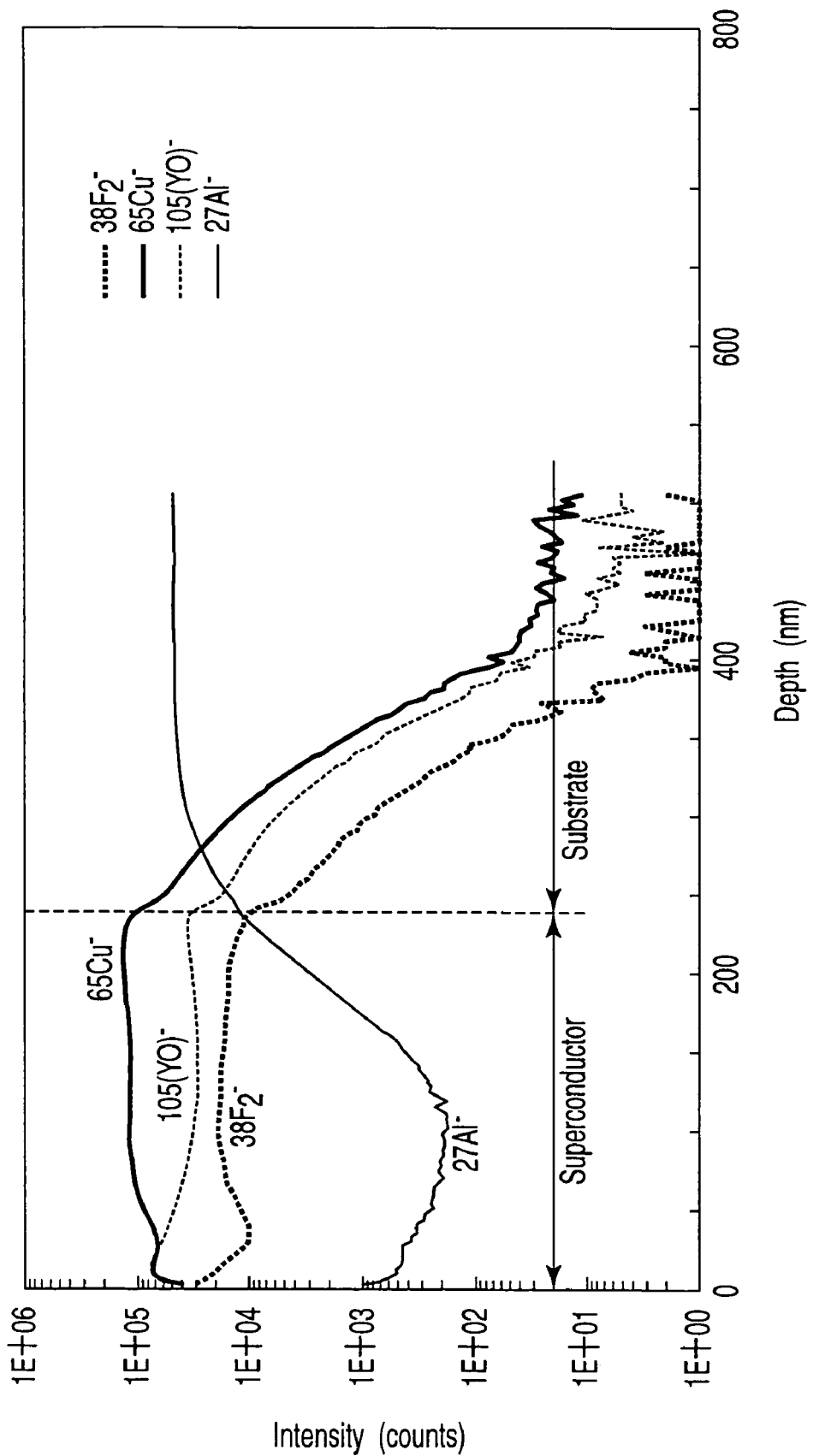
FIG. 6 is a graph showing the results of SIMS analysis of calcined films obtained by calcining in Example 1.

As shown in FIG. 6, fluorine was distributed over the entire calcined film. The molar ratio of fluorine was about 1/10 that of Cu, i.e., the amount was very large.

Figure 7:
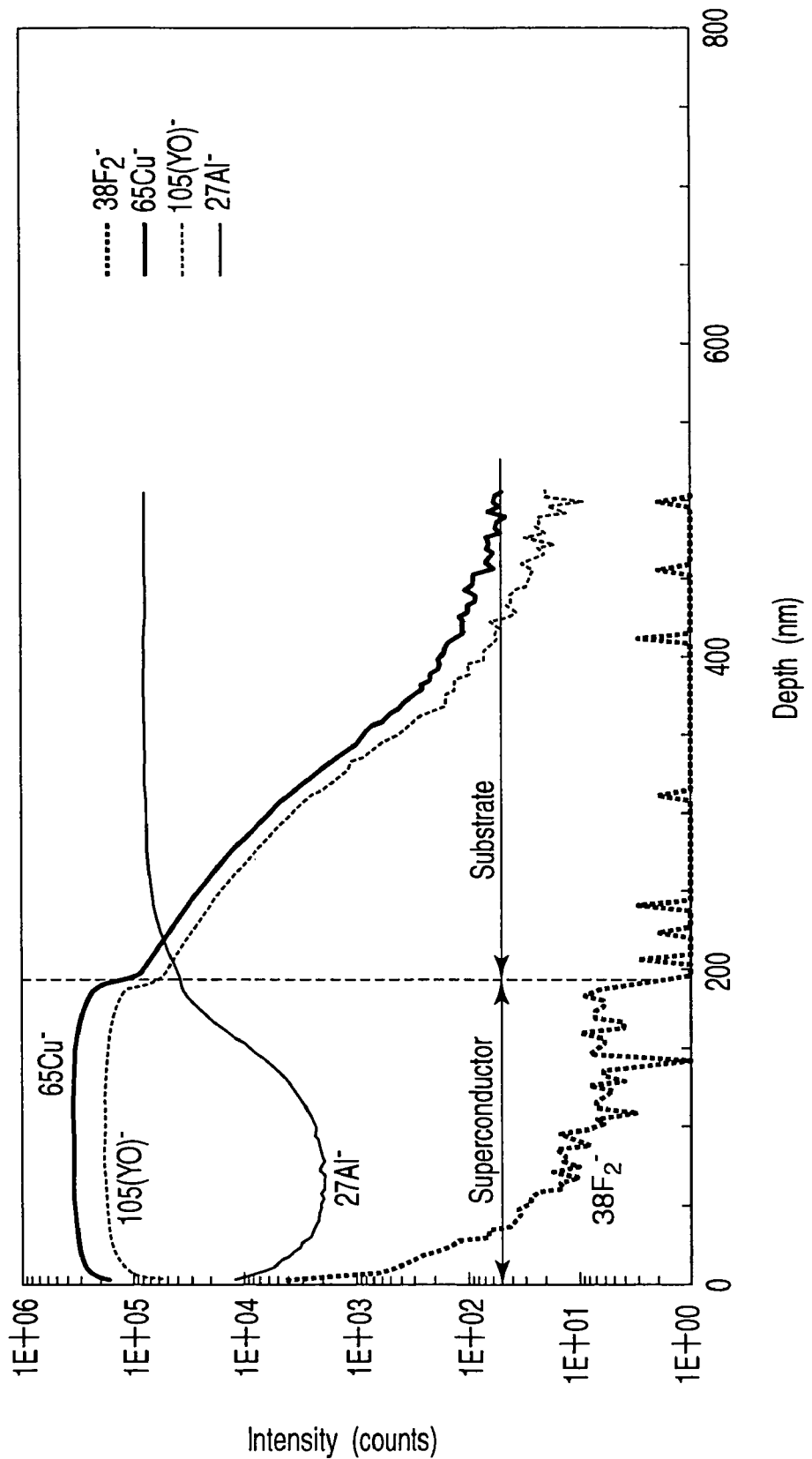
FIG. 7 is a graph showing the results of SIMS analysis of oxide superconducting films obtained by firing in Example 1.

On the other hand, as shown in FIG. 7, in the superconducting film prepared by firing, a large amount of fluorine was distributed on the film surface (near zero of the X axis), but the amount thereof reduced toward the substrate. This phenomenon that the fluorine remained in the film deeply relates to the fact that the removal of hydrogen fluoride was rate-determining in the chemical equilibrium reaction during firing. A superconducting film prepared by TFA-MOD has a unique fluorine distribution shown in FIG. 7, and contains residual fluorine in a molar ratio of $10^{-2}$ to $10^{-6}$ with respect to Cu.

A Ln-based mixed superconductor obtained from a mixed coating solution also has substantially the same residual fluorine amount distribution, because the basic chemical reaction is the same except that Y is partially substituted with Ln.

The critical current density ($J_C$) and critical temperature ($T_C$) of all the samples were measured by the induction method. The measurements were performed at 77 K and 0 T. To check the distribution of the experimental data, an unmixed YBCO superconducting film was prepared for each of the three types of mixing series, and $J_C$ and $T_C$ of each film were measured. As the film thickness concerning the $J_C$ measurement by the induction method, the average film thickness was calculated from the material amount measured by ICP (Inductively Coupled Plasma emission spectroscopy) for square pieces of about 3 mm side divided from each sample. The film thickness was 150 to 220 nm.

Table 1 shows the characteristics of the Y—Gd mixed superconducting films. Table 2 shows the characteristics of the Y—Ho mixed superconducting films. Table 3 shows the characteristics of the Y—Tm mixed superconducting films.

TABLE 1

Characteristics of Y—Gd mixed superconducting films

| Gd content | Molar ratio | 0.000 | 0.085 | 0.269 | 0.500 | 0.700 | 0.903 | 1.000 |
|---|---|---|---|---|---|---|---|---|
| Jc (77K, 0T) | $MA/cm^2$ | 6.32 | 6.59 | 6.67 | 6.83 | 5.33 | 5.06 | 2.24 |
| Tc | K | 90.31 | 91.05 | 91.01 | 91.60 | 91.93 | 92.01 | 92.52 |

TABLE 2

Characteristics of Y—Ho mixed superconducting films

| Ho content | Molar ratio | 0.000 | 0.083 | 0.286 | 0.449 | 0.728 | 0.918 | 1.000 |
|---|---|---|---|---|---|---|---|---|
| Jc (77K, 0T) | $MA/cm^2$ | 6.40 | 6.31 | 6.48 | 6.26 | 6.07 | 6.61 | 6.34 |
| Tc | K | 89.81 | 90.22 | 90.52 | 90.46 | 90.13 | 91.07 | 90.05 |

TABLE 3

Characteristics of Y—Tm mixed superconducting films

| Tm content | Molar ratio | 0.000 | 0.089 | 0.298 | 0.483 | 0.717 | 0.901 | 1.000 |
|---|---|---|---|---|---|---|---|---|
| Jc (77K, 0T) | $MA/cm^2$ | 6.29 | 6.59 | 6.45 | 6.69 | 6.83 | 6.56 | 6.50 |
| Tc | K | 89.62 | 90.51 | 89.71 | 89.93 | 90.40 | 89.85 | 89.67 |

Figure 8:
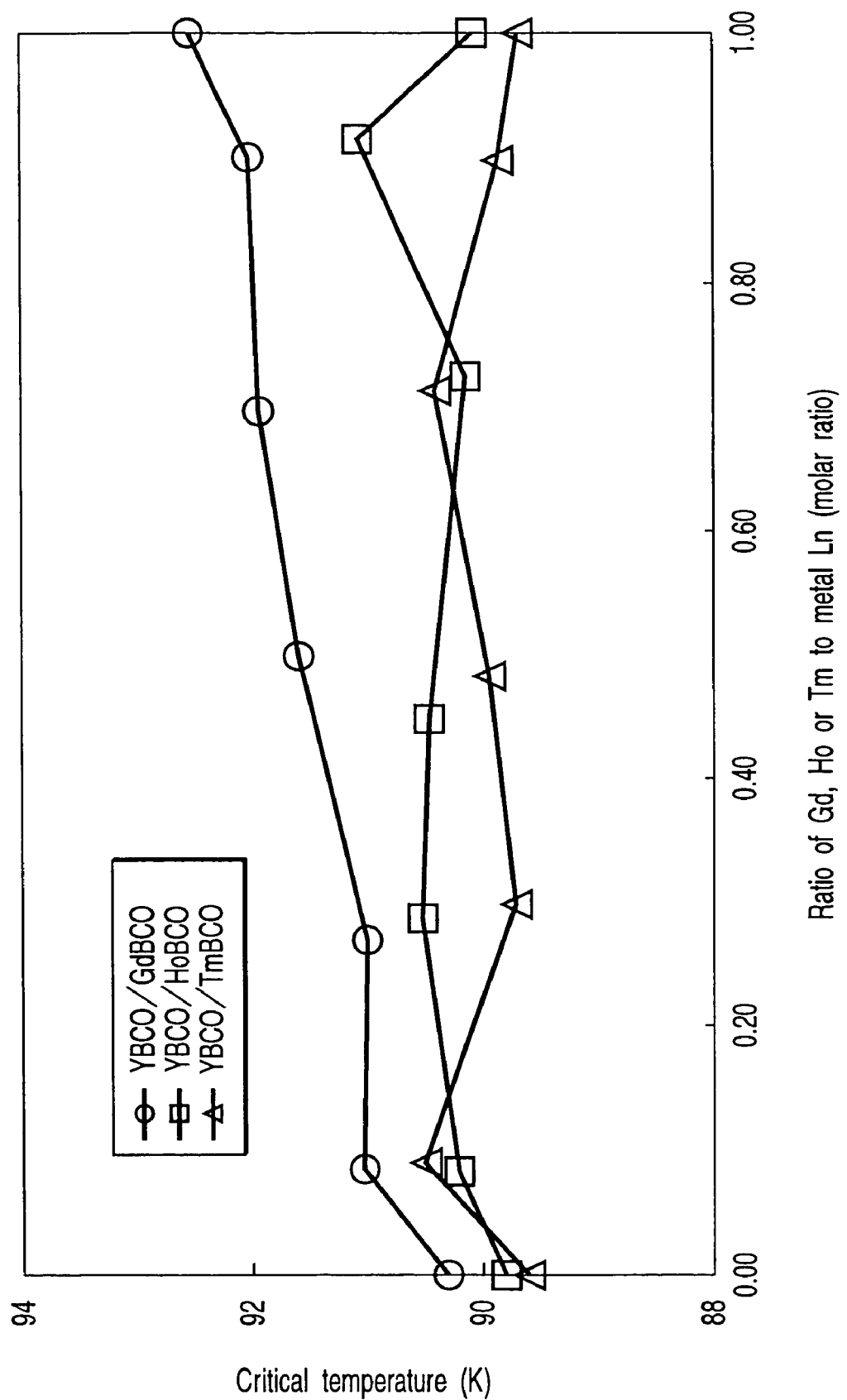
FIG. 8 is a graph showing the relationship between the ratio of Gd, Ho, or Tm to metal Ln and $T_C$ of the oxide superconducting films in Example 1.

FIG. 8 shows the relationship between the ratio of Gd, Ho, or Tm to metal Ln and $T_C$. First, as is apparent from the results of the three samples of the unmixed YBCO superconducting films, the $T_C$ value presumably contains an error of ±0.2 to 0.3 K. Even when this error is taken into consideration, $T_C$ of the YBCO/GdBCO mixed superconducting film has a value intermediate between the YBCO superconducting film and GdBCO superconducting film. The $T_C$ value of each of the two other types of mixed superconducting films is not strictly intermediate between the two unmixed superconducting films, but does not largely differ from the intermediate value. Of the three types of mixed superconducting films, $T_C$ of the YBCO/TmBCO superconducting film is the lowest. This reflects the fact that $T_C$ of an unmixed TmBCO superconducting film is probably the lowest.

The results shown in FIG. 8 imply that the $T_C$ value of a superconductor can be determined by the atomic radius of the metal introduced in the Y site, and also indicate that metal elements introduced in the Y site are homogeneously mixed in a mixed superconductor. That is, in a Y-based superconductor in which 50% of the Gd component are mixed, a network which connects only a Gd-based superconductor may be established. The $T_C$ value may be about 92.5 K of the Gd-based superconductor if this network exists, and about 90.3 K of the Y-based superconductor if the network is disconnected. In practice, however, the $T_C$ value takes an intermediate value. From the foregoing, it is highly likely that atoms are homogeneously dispersed, and the $T_C$ value is determined by the average atomic radius.

Figure 9:
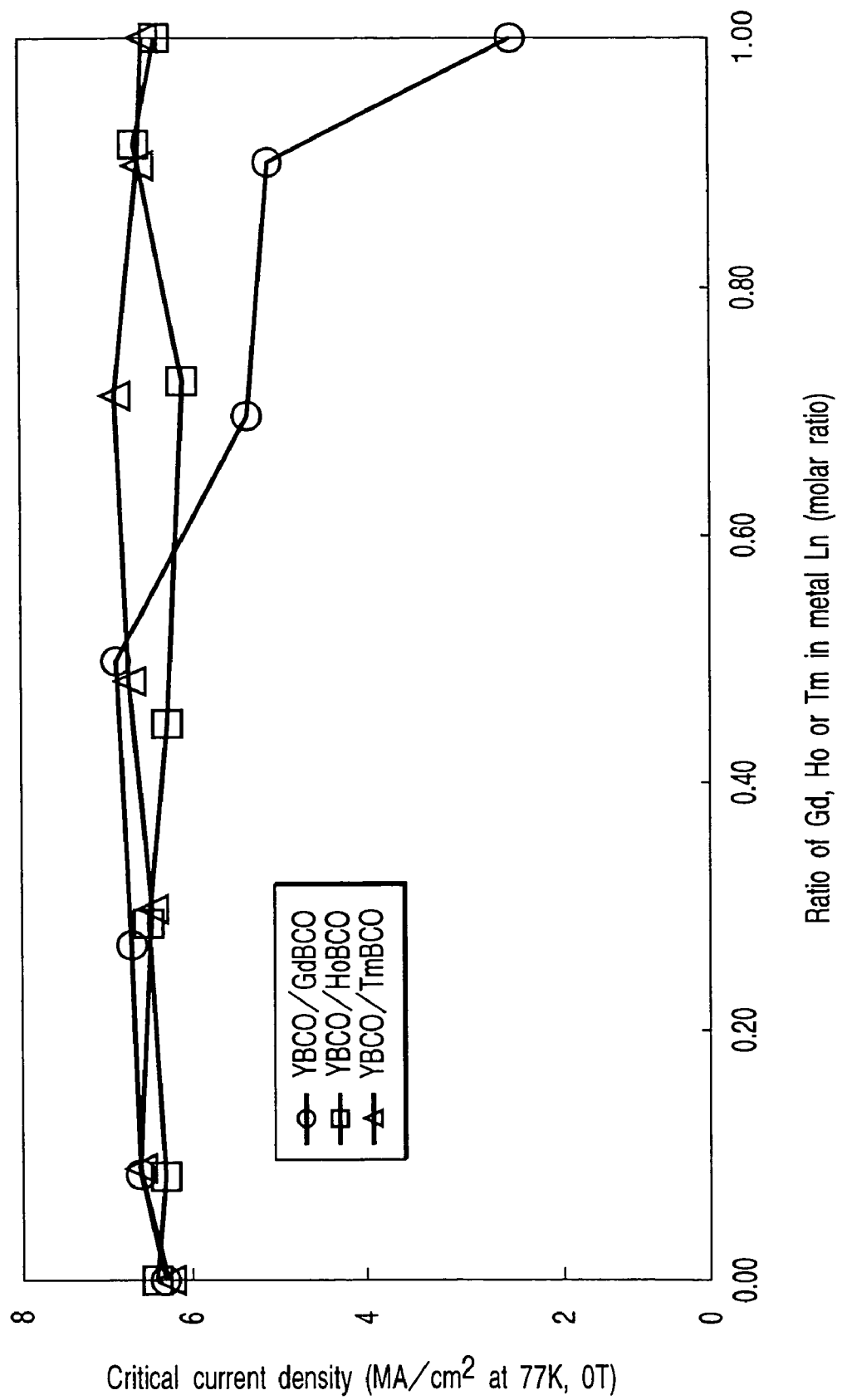
FIG. 9 is a graph showing the relationship between the ratio of Gd, Ho, or Tm to metal Ln and $J_C$ of the oxide superconducting films in Example 1.

FIG. 9 shows the relationship between the ratio of Gd, Ho, or Tm to metal Ln and $J_C$. The superconducting films show $J_C$ values of about 6.5 $MA/cm^2$ (77 K, 0 T), except for some YBCO/GdBCO-based films. This indicates that superconductors having good characteristics are obtained from high-purity solutions. The YBCO/GdBCO-based superconductors are inferior in characteristics probably because the firing conditions, i.e., 800° C. and an oxygen partial pressure of 1,000 ppm are inappropriate. The optimum firing conditions of the GdBCO superconducting films are that the oxygen partial pressure is about 250 ppm at 800° C. In the YBCO/GdBCO mixed superconducting films, superior characteristics can be given by logarithmically proportionally distributing the oxygen partial pressure from 1,000 to 250 ppm in accordance with the amount of Gd component.

Table 4 shows $J_C$ and $T_C$ of superconducting films prepared by firing SL1x37YGdFm, SL1x19YGdFm, and SL1GdsFm at optimum oxygen partial pressures at 800° C. As shown in Table 4, when the optimum firing conditions are used, $J_C$ values of about 6.5 $MA/cm^2$ (77 K, 0 T) are provided.

TABLE 4

| | SL1x37YGdFm | SL1x19YGdFm | SL1GdFm |
|---|---|---|---|
| Oxygen partial pressure [ppm] | 379 | 287 | 250 |
| Jc (77K, 0T) [$MA/cm^2$] | 6.53 | 6.74 | 6.41 |
| Tc [K] | 91.98 | 92.15 | 92.48 |

Improvement in $J_C$ value is also confirmed by the fact that the ratio of a/b-axis-oriented grains decreases in an XRD polar plot. When a film is formed on a $LaAlO_3$ substrate, a/b-axis-oriented grains overlap substrate peaks, so the intensity ratio cannot be known. However, the use of a (103) plane in the polar plot makes it possible to measure the diffraction intensities resulting from a/b-axis-oriented grains and c-axis-oriented grains. Letting I be the diffraction intensity, the ratio of the intensity of a/b-axis-oriented grains to the total intensity of the a/b-axis-oriented grains and c-axis-oriented grains is defined as $r_{ab}=I_{ab}/(I_c+I_{ab})$.

In the conventional method, $r_{ab}$ was never smaller than 0.15, so the characteristics were poor. For example, in an SL1x55YGdFm film (three samples) prepared by the conventional method, the values of $r_{ab}$ were 0.165, 0.250, and 0.181, and the $J_C$ values (77 K, 0 T) were as low as about 1 $MA/cm^2$.

By contrast, in the SL1x55YGdFm film prepared by the method of the present invention, $r_{ab}$ was 0.034, and the $J_C$ value (77 K, 0 T) was 6.83 $MA/cm^2$, which exhibited a great improvement.

Example 2

Powder of about 3.7 hydrate of $(CH_3COO)_3Y$ and blue powder of about 1.0 hydrate of $(CH_3COO)_2Cu$ were dissolved in ion exchange water such that a molar ration of Y:Cu was 1:3 to prepare an acetate solution. The acetate solution and an equimolar amount of pentafluoropropionic acid ($CF_3CF_2COOH$, PFP) were mixed and stirred in an eggplant type flask. The solution mixture was reacted and refined under reduced pressure for about 10 hours with a rotary evaporator to provide a dark blue gel SL2YCupg-PFP. The gel SL2YCupg-PFP was refined by the SIG method to provide a gel SL2YCug-PFP, which was dissolved in methanol to provide a solution SL2YCu-PFP with a concentration of 1.50 mol/L in terms of metal ions.

A solution SL2YCu-HFB with a concentration of 1.50 mol/L in terms of metal ions was provided following the same procedures as above, except that heptafluorobutanoic acid ($CF_3CF_2CF_2COOH$, HFB) was used instead of pentafluoropropionic acid ($CF_3CF_2COOH$, PFP).

$(CH_3COO)_2Ba$ anhydride and an equimolar amount of $CF_3COOH$ were mixed and stirred in an eggplant type flask. The solution mixture was reacted and refined under reduced pressure for about 10 hours with a rotary evaporator to provide white powder SL2Bapg. The powder SL2Bapg was refined by the SIG method to provide SL2Bag, which was dissolved in methanol to provide a solution SL2Ba with a concentration of 1.50 mol/L in terms of metal ions. Since a precipitate is produced if barium acetate is reacted with pentafluoropropionic acid or heptafluorobutanoic acid, no such fluorocarboxylic acids are used.

A coating solution SL2YsPFP was prepared by mixing the solutions SL2YCu-PFP and SL2Ba such that a molar ratio of Y:Ba:Cu was 1:2:3. A coating solution SL2YsHFP was prepared by mixing the solutions SL2YCu-HFB and SL2Ba in the same manner as above. In addition, a coating solution SL2Ys was obtained by using only TFA as fluorocarboxylic acid.

Coating solutions SL2HosPFP, SL2HosHFB, and SL2Hos in that a molar ratio of Ho:Ba:Cu was 1:2:3 were obtained in the same manner as above except that holmium acetate was used instead of yttrium acetate.

Nine types of mixed coating solutions were prepared by mixing the Y-based coating solutions SL2Ys, SL2YsPFP, and SL2YsHFB and the Ho-based coating solutions SL2Hos, SL2HosPFP, and SL2HosHFB at a ratio of 5:5. The mixed coating solutions prepared using SL2Ys were SL2YHoT (TFA)T(TFA), SL2YHoTP(PFP), and SL2YHoTH(HFB). The mixed coating solutions prepared using SL2YsPFP were SL2YHoPT, SL2YHoPP, and SL2YHoPH. The mixed coating solutions prepared using SL2YsHFB were SL2YHoHT, SL2YHoHP, and SL2YHoHH.

Following the same procedures as in Example 1, a (100) $LaAlO_3$ single-crystal substrate was spin-coated with each of the mixed coating solutions, and then a thin superconducting film was obtained by calcining and firing. The nine types of mixed superconducting films were SL2YHoTTFm, SL2YHoTPFm, SL2YHoTHFm, SL2YHoPTFm, SL2YHoPPFm, SL2YHoPHFm, SL2YHoHTFm, SL2YHoHPFm, and SL2YHoHHFm.

$J_C$ and $T_C$ of each of these mixed superconducting films were measured following the same procedures as in Example 1. Table 5 shows the results. As shown in Table 5, the characteristics were not largely deteriorated even in the mixed superconducting films prepared using PFP and HFB as fluorocarboxylic acids. However, the longer the carbon chain of the fluorocarboxylic acid used, the poorer the characteristics of the mixed superconducting film. Note that $r_{ab}$ was 0.15 or less for all the mixed superconducting films shown in Table 5.

TABLE 5

Characteristics of mixed superconducting films prepared by using long-chain fluorocarboxylic acids

|  |  | SL2Ys | SL2YsPFP | SL2YsHFB |
|---|---|---|---|---|
| SL2Hos | Jc (77K, 0T) [$MA/cm^2$] | 6.38 | 6.02 | 5.64 |
|  | Tc [K] | 90.35 | 90.36 | 90.11 |
| SL2HosPFP | Jc (77K, 0T) [$MA/cm^2$] | 6.10 | 5.72 | 5.49 |
|  | Tc [K] | 90.28 | 90.21 | 89.97 |
| SL2HosHFB | Jc (77K, 0T) [$MA/cm^2$] | 5.57 | 5.32 | 4.76 |
|  | Tc [K] | 90.17 | 90.02 | 89.60 |

Example 3

Powder of about 3.7 hydrate of $(CH_3COO)_3Y$ was dissolved in ion exchange water, and the solution was mixed with an equimolar amount of trifluoroacetic acid ($CF_3COOH$, TFA) in an eggplant type flask. The mixture was reacted and refined under reduced pressure for about 10 hours with a rotary evaporator to prepare white powder SL3Ypg. The powder SL3Ypg was refined by the SIG method to prepare SL3Yg, which was dissolved in methanol to prepare a solution SL3Y with a concentration of 1.50 mol/L in terms of metal ions.

White powder SL3Gdpg was provided following the same procedures as above except that powder of about 4.4 hydrate of $(CH_3COO)_3Gd$ was used instead of the powder of about 3.7 hydrate of $(CH_3COO)_3Y$. The powder SL3Gdpg was refined by the SIG method to prepare SL3Gdg, which was dissolved in methanol to prepare a solution SL3Gd with a concentration of 1.50 mol/L in terms of metal ions.

Light orange powder SL3Hopg was provided following the same procedures as above except that powder of about 5.1 hydrate of $(CH_3COO)_3Ho$ was used instead of the powder of about 3.7 hydrate of $(CH_3COO)_3Y$. The powder SL3Hopg was refined by the SIG method to prepare SL3Hog, which was dissolved in methanol to prepare a solution SL3Ho with a concentration of 1.50 mol/L in terms of metal ions.

White powder SL3Tmpg was provided following the same procedures as above except that powder of about 4.3 hydrate of $(CH_3COO)_3Tm$ was used instead of the powder of about 3.7 hydrate of $(CH_3COO)_3Y$. The powder SL3Tmpg was refined by the SIG method to prepare SL3Tmg, which was dissolved in methanol to prepare a solution SL3Tm with a concentration of 1.50 mol/L in terms of metal ions.

$(CH_3COO)_2Ba$ anhydride and blue powder of about 1.0 hydrate of $(CH_3COO)_2Cu$ were dissolved in ion exchange water such that a molar ratio of Ba:Cu was 2:3. The solution and an equimolar amount of trifluoroacetic acid ($CF_3COOH$, TFA) were mixed and stirred in an eggplant type flask. The solution mixture was reacted and refined under reduced pressure for about 10 hours with a rotary evaporator to provide a dark blue gel SL3BaCupg. The gel SL3BaCupg was refined by the SIG method to provide a dark blue gel SL3BaCug, which was dissolved in methanol to prepare a solution SL3BaCu with a concentration of 1.50 mol/L in terms of metal ions.

A coating solution SL3Ys was prepared by mixing the solutions SL3Y and SL3BaCu such that a molar ratio of Y:Ba:Cu was 1:2:3. A coating solution SL3Gds was prepared by mixing the solutions SL3Gd and SL3BaCu in the same manner as above. A coating solution SL3Hos was prepared by mixing the solutions SL3Ho and SL3BaCu in the same manner as above. A coating solution SL3Tms was prepared by mixing the solutions SL3Tm and SL3BaCu in the same manner as above.

Mixed coating solutions SL3x91YGd, SL3x73YGd, SL3x37YGd, and SL3x19YGd were prepared by mixing the coating solutions SL3Ys and SL3Gds at ratios of 9:1, 7:3, 3:7, and 1:9, respectively.

Mixed coating solutions SL3x91YHo, SL3x73YHo, SL3x37YHo, and SL3x19YHo were prepared by mixing the coating solutions SL3Ys and SL3Hos in the same manner as above.

Mixed coating solutions SL3x91YTm, SL3x73YTm, SL3x37YTm, and SL3x19YTm were prepared by mixing the coating solutions SL3Ys and SL3Tms in the same manner as above.

Mixed coating solutions SL3x91GdHo, SL3x73GdHo, SL3x37GdHo, and SL3x19GdHo were prepared by mixing the coating solutions SL3Gds and SL3Hos in the same manner as above.

Mixed coating solutions SL3x91GdTm, SL3x73GdTm, SL3x37GdTm, and SL3x19GdTm were prepared by mixing the coating solutions SL3Gds and SL3Tms in the same manner as above.

Mixed coating solutions SL3x91HoTm, SL3x73HoTm, SL3x37HoTm, and SL3x19HoTm were prepared by mixing the coating solutions SL3Hos and SL3Tms in the same manner as above.

Following the same procedures as in Example 1, a (100) $LaAlO_3$ single-crystal substrates was spin-coated with each of the mixed coating solutions, and a superconducting film was provided by calcining and firing. Note that when a mixed superconducting film containing Gd was to be prepared, the optimum oxygen partial pressure in firing was calculated in accordance with the amount of Gd component as described in Example 1, and the calculated oxygen partial pressure was used. $J_C$ and $T_C$ of each of these mixed superconducting films were measured following the same procedures as in Example 1.

Table 6 shows the characteristics of the Y—Gd mixed superconducting films. Table 7 shows the characteristics of the Y—Ho mixed superconducting films. Table 8 shows the characteristics of the Y—Tm mixed superconducting films.

Although the characteristic values shown in Tables 6 to 8 are apparently more or less worse than those shown in Tables 1 to 3, the differences may be experimental errors. Generally, favorable values were obtained.

TABLE 6

Characteristics of Y—Gd mixed superconducting films

| Gd content | Molar ratio | 0.115 | 0.297 | 0.682 | 0.889 |
|---|---|---|---|---|---|
| Jc (77K, 0T) | $MA/cm^2$ | 6.37 | 6.46 | 6.54 | 6.27 |
| Tc | K | 91.08 | 91.13 | 91.88 | 92.10 |

TABLE 7

Characteristics of Y—Ho mixed superconducting films

| Ho content | Molar ratio | 0.093 | 0.296 | 0.710 | 0.905 |
|---|---|---|---|---|---|
| Jc (77K, 0T) | $MA/cm^2$ | 6.22 | 6.25 | 6.21 | 6.52 |
| Tc | K | 90.18 | 90.40 | 90.70 | 90.99 |

TABLE 8

Characteristics of Y—Tm mixed superconducting films

| Tm content | Molar ratio | 0.088 | 0.300 | 0.701 | 0.898 |
|---|---|---|---|---|---|
| Jc (77K, 0T) | $MA/cm^2$ | 6.44 | 6.33 | 6.42 | 6.30 |
| Tc | K | 90.50 | 90.00 | 90.21 | 90.07 |

Table 9 shows the characteristics of the Gd—Ho mixed superconducting films. Table 10 shows the characteristics of the Gd—Tm mixed superconducting films. Table 11 shows the characteristics of the Ho—Tm mixed superconducting films. Since unmixed GdBCO, HoBCO, and TmBCO superconducting films have similar characteristics, the mixed superconducting films also had similar characteristics. However, it was found that the characteristics of the mixed superconducting films were not largely deteriorated by the method of the present invention, unlike in the conventional method.

TABLE 9

Characteristics of Gd—Ho mixed superconducting films

| Ho content | Molar ratio | 0.102 | 0.288 | 0.715 | 0.921 |
|---|---|---|---|---|---|
| Jc (77K, 0T) | $MA/cm^2$ | 6.54 | 6.28 | 6.41 | 6.36 |
| Tc | K | 92.30 | 91.90 | 91.17 | 90.90 |

TABLE 10

Characteristics of Gd—Tm mixed superconducting films

| Ho content | Molar ratio | 0.084 | 0.285 | 0.684 | 0.875 |
|---|---|---|---|---|---|
| Jc (77K, 0T) | $MA/cm^2$ | 6.46 | 6.38 | 6.31 | 6.50 |
| Tc | K | 92.14 | 91.77 | 90.67 | 90.72 |

TABLE 11

Characteristics of Ho—Tm mixed superconducting films

| Tm content | Molar ratio | 0.097 | 0.281 | 0.712 | 0.904 |
|---|---|---|---|---|---|
| Jc (77K, 0T) | MA/cm$^2$ | 6.16 | 6.34 | 6.42 | 6.10 |
| Tc | K | 90.34 | 90.36 | 90.10 | 89.80 |

Example 4

Powder of about 3.7 hydrate of $(CH_3COO)_3Y$ and blue powder of about 1.0 hydrate of $(CH_3COO)_2Cu$ were dissolved in ion exchange water such that a molar ratio of Y:Cu was 1:3 to prepare an acetate solution. The acetate solution and an equimolar amount of pentafluoropropionic acid $(CF_3CF_2COOH, PFP)$ were mixed and stirred in an eggplant type flask. The solution mixture was reacted and refined under reduced pressure for about 10 hours with a rotary evaporator to provide a dark blue gel SL4YCupg-PFP. The gel SL4YCupg-PFP was refined by the SIG method to provide a gel SL4YCug-PFP, which was dissolved in methanol to prepare a solution SL4YCu-PFP with a concentration of 1.50 mol/L in terms of metal ions. An equimolar amount of trifluoroacetic acid $(CF_3COOH, TFA)$ was added to this solution, and the mixture was refined by the SIG method to prepare a solution SL4YCu.

$(CH_3COO)_2Ba$ anhydride and an equimolar amount of $CF_3COOH$ were mixed and stirred in an eggplant type flask. The solution mixture was reacted and refined under reduced pressure for about 10 hours with a rotary evaporator to provide white powder SL4Bapg. The powder SL4Bapg was refined by the SIG method to provide SL4Bag, which was dissolved in methanol to prepare a solution SL4Ba with a concentration of 1.50 mol/L in terms of metal ions. Since a precipitate is produced if barium acetate is reacted with pentafluoropropionic acid or heptafluorobutanoic acid, no such fluorocarboxylic acids are used.

A coating solution SL4Ys was prepared by mixing the solutions SL4YCu and SL4Ba such that a molar ratio of Y:Ba:Cu was 1:2:3.

A coating solution SL4Hos in which a molar ratio of Ho:Ba:Cu was 1:2:3 was obtained in the same manner as above except that holmium acetate was used instead of yttrium acetate.

Mixed coating solutions SL4x91YHo, SL4x73YHo, SL4x37YHo, and SL4x19YHo were prepared by mixing the coating solutions SL42Ys and SL4Hos at ratios of 9:1, 7:3, 3:7, and 1:9, respectively.

Following the same procedures as in Example 1, a (100) $LaAlO_3$ single-crystal substrates was spin-coated with each mixed coating solution, and a superconducting film was provided by calcining and firing. $J_C$, $T_C$, and $r_{ab}$ of each of these mixed superconducting films SL4x91YHoFm, SL4x73YHoFm, SL4x37YHoFm, and SL4x19YHoFm were measured following the same procedures as in Example 1. Table 12 shows the results of the measurements.

TABLE 12

Characteristics of Y—Ho mixed superconducting films

|  |  | SL4x 91YHoFm | SL4x 73YHoFm | SL4x 37YHoFm | SL4x 19YHoFm |
|---|---|---|---|---|---|
| Jc (77K, 0T) | MA/cm$^2$ | 6.27 | 6.35 | 6.18 | 6.48 |
| Tc | K | 90.18 | 90.32 | 90.65 | 90.84 |
| r(a/b) | — | 0.042 | 0.037 | 0.031 | 0.052 |

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An oxide superconductor comprising:
   a main component represented by the following formula:

$LnBa_2Cu_3O_{7-x}$, where Ln comprises two or more types of elements selected from the group consisting of Gd, Tb, Dy, Ho, Er, Tm, and Y, and a content of each element is 10 to 90 mol %; and
   fluorine at a molar ratio of $10^{-2}$ to $10^{-6}$ with respect to copper, and wherein a ratio of intensity of a/b-axis-oriented grains and c-axis-oriented grains observed by X-ray diffraction is not more than 15%.

2. The oxide superconductor according to claim 1, wherein the oxide superconductor is formed as a film with a thickness of 0.05 to 10 μm on a substrate.

3. The oxide superconductor according to claim 2, wherein an area ratio of a biaxially oriented layer at an interface between the substrate and the film is not less than 95%, and a biaxial orientation ratio in a surface portion of the film is not more than 80% based on transmission electron microscope observation in a cross-section perpendicular to a plane of the substrate.

4. An oxide superconductor according to claim 2, wherein the film has a structure in which grain boundaries having a bonding angle of about 0.2° to 1° are regularly arranged every 5 to 50 nm based on transmission electron microscope observation in a plane parallel to the substrate and apart by 50 nm from the substrate in a direction perpendicular to the substrate.

5. A method of preparing the oxide superconductor according to claim 1, comprising:
   reacting solutions of an acetate of metal Ln (where Ln comprises two or more types of elements selected from the group consisting of Gd, Tb, Dy, Ho, Er, Tm, and Y, and a content of each element is 10 to 90 mol %), barium acetate, and copper acetate, singly or in a form of a mixture, with fluorocarboxylic acid, followed by refining a reaction product to produce a gel;
   dissolving the gel in a solvent mainly containing alcohol such that Ln, barium, and copper are contained at a molar ratio of about 1:2:3 to prepare a coating solution; and
   coating a substrate with the coating solution to form a film, followed by calcining and firing the film to prepare an oxide superconducting film;
   wherein a gel obtained by first refining is dissolved in alcohol to provide a solution containing impurities, and then the solution is refined again to provide a gel containing a reduced amount of impurities.

6. The method according to claim 5, wherein the fluorocarboxylic acid is selected from the group consisting of trifluoroacetic acid, pentafluoropropionic acid, and heptafluorobutanoic acid.

7. The method according to claim 5, wherein the solution of barium acetate is reacted with trifluoroacetic acid.

8. The method according to claim 5, wherein the alcohol mainly contains methanol.

9. The method according to claim 5, wherein the fluorocarboxylic acid used in the reaction is substituted with another fluorocarboxylic acid having a small number of carbon atoms after the reaction.

10. An oxide superconductor comprising:
a main component represented by the following formula:

$LnBa_2Cu_3O_{7-x}$, where Ln comprises two or more types of elements selected from the group consisting of Gd, Tb, Dy, Ho, Er, Tm, and Y, and a content of each element is 10 to 90 mol %, and fluorine at a molar ratio of $10^{-2}$ to $10^{-6}$ with respect to copper, wherein the oxide superconductor is formed as a film with a thickness of 0.05 to 10 μm on a substrate, and wherein the film has a structure in which grain boundaries having a bonding angle of about 0.2° to 1° are regularly arranged every 5 to 50 nm based on transmission electron microscope observation in a plane parallel to the substrate and apart by 50 nm from the substrate in a direction perpendicular to the substrate.

11. The oxide superconductor according to claim 10, wherein a ration of intensity of a/b-axis-oriented grains to total intensity of the a/b-axis-oriented grains and c-axis-oriented grains observed by X-ray diffraction is not more than 15%.

12. The oxide superconductor according to claim 10, wherein an area ratio of a biaxially oriented layer at an interface between the substrate and the film is not less than 95%, and a biaxial orientation ratio in a surface portion of the film is not more than 80% based on transmission electron microscope observation in a cross-section perpendicular to a plane of the substrate.

* * * * *